United States Patent
Syu et al.

(10) Patent No.: US 8,966,343 B2
(45) Date of Patent: Feb. 24, 2015

(54) SOLID-STATE DRIVE RETENTION MONITOR USING REFERENCE BLOCKS

(75) Inventors: Mei-Man L. Syu, Fremont, CA (US); Jui-Yao Yang, San Jose, CA (US); Dengtao Zhao, Santa Clara, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 143 days.

(21) Appl. No.: 13/590,489

(22) Filed: Aug. 21, 2012

(65) Prior Publication Data

US 2014/0059405 A1    Feb. 27, 2014

(51) Int. Cl.
| | | |
|---|---|---|
| G11C 29/00 | (2006.01) | |
| G06F 11/10 | (2006.01) | |
| G11C 16/04 | (2006.01) | |
| G11C 29/52 | (2006.01) | |

(52) U.S. Cl.
CPC ............ *G06F 11/1068* (2013.01); *G11C 16/04* (2013.01); *G06F 11/1072* (2013.01); *G11C 29/52* (2013.01)
USPC .................. 714/773; 365/185.09; 365/185.11

(58) Field of Classification Search
CPC .................................................... G06F 11/106
USPC ................................. 714/42, 763; 365/185.25
See application file for complete search history.

(56) References Cited

U.S. PATENT DOCUMENTS

| | | | |
|---|---|---|---|
| 6,856,556 B1 | 2/2005 | Hajeck | |
| 7,126,857 B2 | 10/2006 | Hajeck | |
| 7,315,970 B2 * | 1/2008 | Arakawa et al. | 714/718 |
| 7,430,136 B2 | 9/2008 | Merry, Jr. et al. | |
| 7,447,807 B1 | 11/2008 | Merry et al. | |
| 7,502,256 B2 | 3/2009 | Merry, Jr. et al. | |
| 7,509,441 B1 | 3/2009 | Merry et al. | |
| 7,596,643 B2 | 9/2009 | Merry, Jr. et al. | |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |
| 7,765,373 B1 | 7/2010 | Merry et al. | |
| 7,898,855 B2 | 3/2011 | Merry, Jr. et al. | |
| 7,912,991 B1 | 3/2011 | Merry et al. | |
| 7,936,603 B2 | 5/2011 | Merry, Jr. et al. | |
| 7,962,792 B2 | 6/2011 | Diggs et al. | |
| 8,078,918 B2 | 12/2011 | Diggs et al. | |
| 8,090,899 B1 | 1/2012 | Syu | |

(Continued)

FOREIGN PATENT DOCUMENTS

| | | |
|---|---|---|
| CN | 1914689 A | 2/2007 |
| CN | 103632730 | 3/2014 |

OTHER PUBLICATIONS

Robert L. Horn, U.S. Appl. No. 13/110,639, filed May 18, 2011, 29 pages.

*Primary Examiner* — Esaw Abraham

(57) ABSTRACT

A solid-state storage retention monitor determines whether user data in a solid-state device is in need of a scrubbing operation. One or more reference blocks may be programmed with a known data pattern, wherein the reference block(s) experiences substantially similar P/E cycling, storage temperature, storage time, and other conditions as the user blocks. The reference blocks may therefore effectively represent data retention properties of the user blocks and provide information regarding whether/when a data refreshing operation is needed.

24 Claims, 8 Drawing Sheets

(56) References Cited

U.S. PATENT DOCUMENTS

| | | | |
|---|---|---|---|
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,338 B2 * | 12/2012 | Lee et al. ........... 711/103 |
| 8,341,339 B1 | 12/2012 | Boyle et al. |
| 8,365,030 B1 * | 1/2013 | Choi et al. ........... 714/746 |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,539,315 B2 * | 9/2013 | Hashimoto ........... 714/773 |
| 8,549,236 B2 | 10/2013 | Diggs et al. |
| 8,583,835 B1 | 11/2013 | Kan |
| 8,593,884 B2 * | 11/2013 | Park et al. ........... 365/189.011 |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2001/0047497 A1 * | 11/2001 | Larson et al. ........... 714/42 |
| 2006/0288153 A1 | 12/2006 | Tanaka et al. |
| 2008/0239811 A1 | 10/2008 | Tanaka |
| 2008/0270680 A1 | 10/2008 | Chang |
| 2009/0172267 A1 | 7/2009 | Oribe et al. |
| 2010/0174849 A1 | 7/2010 | Walston et al. |
| 2010/0250793 A1 | 9/2010 | Syu |
| 2010/0318733 A1 | 12/2010 | Seo et al. |
| 2010/0332943 A1 | 12/2010 | D'Abreu et al. |
| 2011/0066899 A1 | 3/2011 | Kang et al. |
| 2011/0099323 A1 | 4/2011 | Syu |
| 2011/0231730 A1 | 9/2011 | Allen |
| 2011/0283049 A1 | 11/2011 | Kang et al. |
| 2012/0002468 A1 | 1/2012 | Sarin et al. |
| 2012/0030529 A1 | 2/2012 | Roohparvar et al. |
| 2012/0210076 A1 * | 8/2012 | Jang et al. ........... 711/154 |
| 2012/0254519 A1 * | 10/2012 | Ellis ........... 711/103 |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 * | 12/2012 | Strange et al. ........... 711/165 |
| 2013/0128666 A1 * | 5/2013 | Avila et al. ........... 365/185.11 |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

* cited by examiner

SOLID-STATE DRIVE RETENTION MONITOR USING REFERENCE BLOCKS

BACKGROUND

1. Technical Field

This disclosure relates to solid-state storage devices. More particularly, the disclosure relates to systems and methods for monitoring data retention in solid-state storage devices.

2. Description of the Related Art

Non-volatile solid-state media can become corrupted over time due to various time-related and environmental factors. Periodic data scrubbing (reading data out and reprogramming the error-corrected version) can decrease the likelihood of user data error becoming uncorrectable by transferring physical data storage location before data retention properties of a block of data degrade beyond an acceptable threshold. Although various methods may be implemented to monitor data retention properties of solid-state storage, such as by storing real time-stamp information, such methods often require a substantial amount of storage space to accommodate.

BRIEF DESCRIPTION OF THE DRAWINGS

Systems and methods that embody the various features of the invention will now be described with reference to the following drawings, in which.

DETAILED DESCRIPTION

Figure 1:
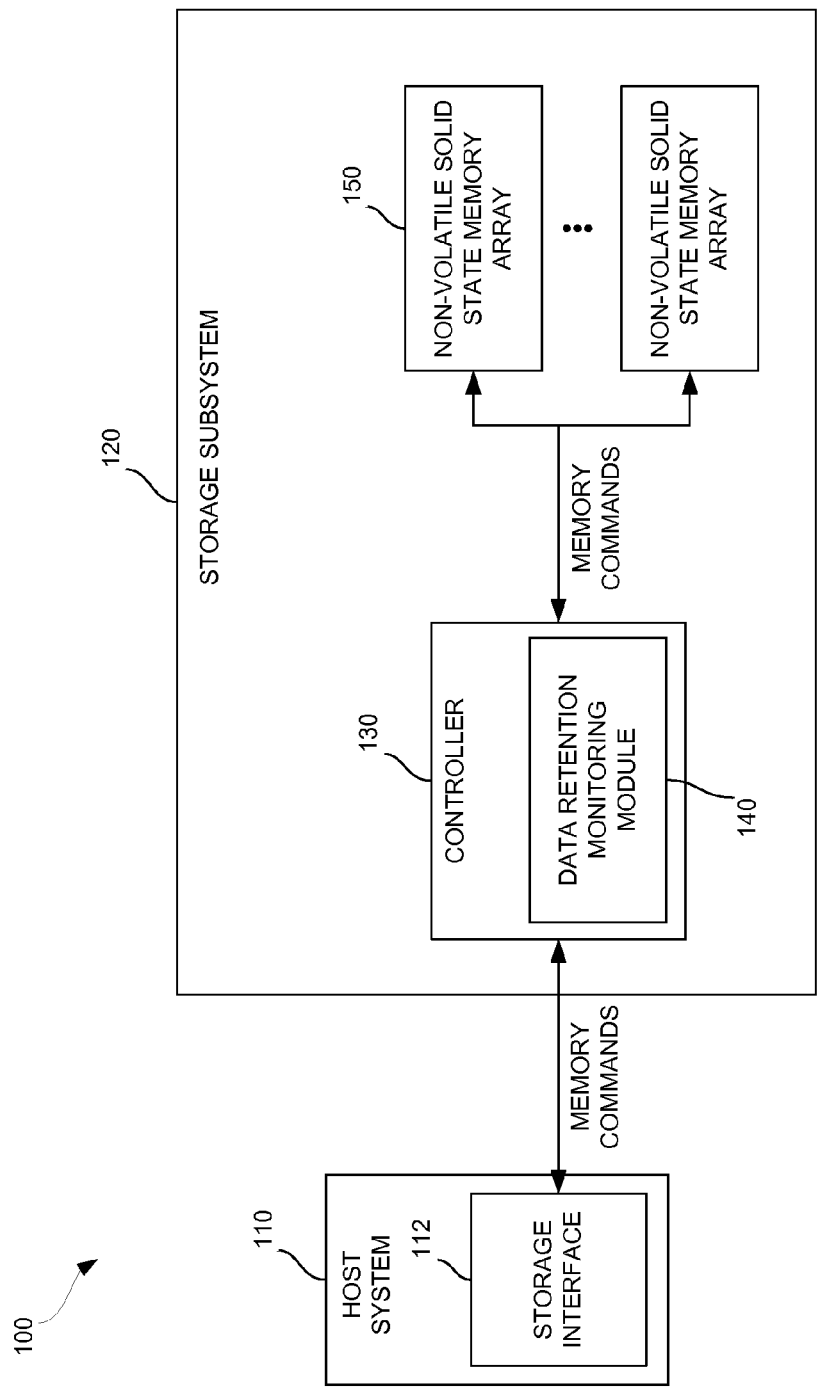
FIG. 1 is a block diagram illustrating a storage device embodiment with a data retention monitoring module.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Overview

Data refreshing or scrubbing is commonly used in solid-state drive (SSD) applications to refresh data stored in the SSD before data retention degrades to a point that the data cannot be correctly read out. Data scrubbing is an error correction technique that uses a background task that periodically inspects memory for errors, and then corrects the error using error-correcting code (ECC) memory or another copy of the data. Data scrubbing can reduce the risk of occurrence of uncorrectable errors. Certain data storage systems monitor retention characteristics of blocks of memory and perform data scrubbing when such retention characteristics have likely degraded beyond a threshold. In order to determine when blocks of memory require scrubbing, a real time stamp may be used to monitor data age in a SSD system, which may be indicative of retention characteristics. The system then, based on the amount of time since the blocks were programmed, decides if a data refreshing, or scrubbing, is needed.

In order to implement a real time stamp solution, some amount of storage space must be allocated to store the time stamp, as much as a few bytes of data. Therefore, with respect to a solid-state storage module, time stamp data consumes usable capacity, thereby reducing user-usable capacity. Furthermore, it may be desirable for the time-stamp storage to be implemented at the page level in order to accurately account for different pages that were programmed at different times, which may require a significant amount of storage space to accommodate.

In addition to age, environmental factors also may have an effect on the data retention of a solid-state drive, especially for heavily cycled blocks. For example, the temperature at which the device is stored, which can vary over time and location, can affect the retention characteristics of a drive. In fact, according to the Arrhenius equation, data retention degradation acceleration due to elevated temperature is an exponential function, and thus can be very significant. Temperature and other environmental factors (e.g., electric/magnetic fields) are not generally taken into account merely by recording time stamp data, and therefore other techniques/mechanisms may be desirable or required in order to more accurately and/or more efficiently make data retention determinations.

Some embodiments disclosed herein enable controller firmware, upon power up or at another time, to check information from designated reference blocks and estimate data retention characteristics of blocks and/or pages of solid-state memory. For example, by reading a reference block, as described in greater detail below, a system may estimate an effective age, and/or other data retention factors, of data programmed on a solid-state drive. Such determinations advantageously inherently take into account various environmental conditions experienced by the drive, even when the device is powered off. With the estimated age, controller firmware may be configured to schedule a data scrubbing process.

The system may save a predetermined value in a reference block and later read data from the block and determine in some manner the block's data retention properties. Based on such reading, the system may determine an equivalent age of the programmed data, taking into account both temperature and the duration of time the SSD is in a power-off state; the information relating to data retention during a power-off period is inherently incorporated in the reference block, and therefore the controller may be able to determine subsequent refreshing/scrubbing timing when powered on again.

The various embodiments described in this disclosure increase the efficiency and/or accuracy of data retention evaluations, which may improve performance of the data storage system.

As used in this application, "non-volatile memory" may refer to solid-state memory such as NAND flash. However, the systems and methods of this disclosure may also be useful in more conventional hard drives and hybrid drives including both solid-state and hard drive components. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile memory) chips. The solid-state storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

System Overview

FIG. 1 is a block diagram illustrating a data storage device embodiment with a data retention monitoring module. As shown, a storage device 120 includes a controller 130, which in turn includes a data retention monitoring module 140. In certain embodiments, the data retention monitoring module 140 is responsible for monitoring data retention characteristics of one or more pages or blocks of one or more non-volatile solid-state memory arrays 150 and issuing data scrubbing commands, with the controller 130 relaying those commands to the non-volatile solid-state memory arrays 150 for execution. In one embodiment, the data retention monitoring module 140 is configured to select reference blocks of the non-volatile solid-state memory arrays 150 and schedule data scrubbing operations in accordance with one or more methods described herein. In certain embodiments, the controller 130 is configured to receive memory commands from a storage interface (e.g., driver) 112 residing on a host system 110 and execute commands in response to such host-issued memory commands in the non-volatile solid-state memory arrays 150. Data may be accessed/transferred based on those commands.

Data Retention Monitoring

In certain solid-state storage devices, such as a storage device comprising NAND flash components, blocks or pages of storage within the device may be configured to withstand a certain number of program and erase (P/E) operations applied thereto before such operations have a significant adverse affect on the data retention properties of the block or page. Within a solid-state drive comprising NAND flash components, blocks of storage may comprise approximately 2 MB or 4 MB of storage space. In general, once a block is cycled up to a limit (e.g., 3K cycles for 2×nm MLC), the quality of this block may start degrading significantly.

Certain embodiments disclosed herein provide assignment of one or more blocks across one or more solid-state memory devices as reference blocks. Each reference block may be programmed with pre-defined data value, such as a random data pattern. For example, the pre-defined data value could be generated by a pseudo-random number generator with a known seed, so that the pre-defined data need not to be stored in a particular manner. Reference blocks advantageously may have a device usage history that is similar as that of the related data blocks, meaning that the information collected from the reference blocks can reflect the actual conditions experienced by the related data blocks closely enough such that the reference blocks can be considered valid references with respect to the related data blocks.

In certain embodiments, after power on of the SSD, controller firmware may read data from the reference block(s) and use a data retention estimation mechanism disclosed herein to estimate the elapsed time since the reference block has been programmed. Such estimation may allow for the determination of improved data scrubbing schedules. The estimated elapsed time may incorporate information related to the duration before power-off as well as the duration of the SSD system in power-off mode.

Figure 2:
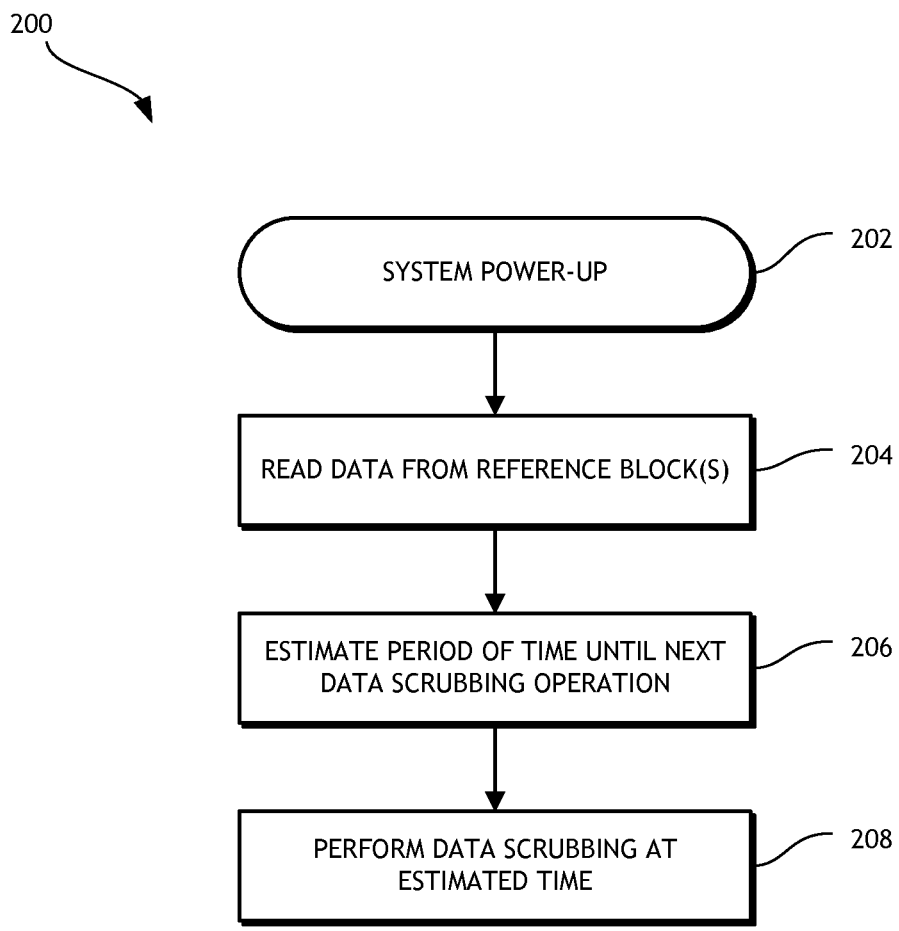
FIG. 2 is a flow diagram showing a process for monitoring data retention characteristics/properties of a solid-state storage device in accordance with one or more embodiments.

FIG. 2 is a flow diagram showing a process 200 of monitoring data retention characteristics/properties of a solid-state memory device in accordance with one or more embodiments. As discussed above, data scrubbing may involve transferring data from one location in a non-volatile solid-state storage device to another, and may be desirable in order to prevent data stored in the device from degrading before data retention factors result in uncorrectable ECC. In one embodiment, the process 200 is performed at least partially by the controller 130 and/or data retention monitoring module 140. At block 202, a data storage device is powered up. Subsequent to power up, data is read from one or more predetermined reference blocks of a non-volatile solid-state memory device at block 204. In some embodiments, the reference blocks may be read at times other than shortly after power-up, such as when idle time is detected (a period with no host-initiated commands), or the reads may be triggered by some other factors such as P/E cycle counts, temperature, etc. In certain embodiments, data retention properties of the reference block(s) are at least partially representative of data retention properties of a larger group of blocks of data in the storage device. Therefore, reading data values from the reference block(s) to determine the data retention condition of the block(s) may assist in estimating the data retention condition of the related blocks.

At block 206, the time until the next data scrubbing operation is determined in response to reading data from the one or more reference blocks. Such estimation may be performed based on one or more of the data retention estimation mechanisms disclosed herein. Once the data scrubbing schedule has been determined, at block 208, data scrubbing is performed according to such schedule, thereby at least partially preserving data retention functionality of the solid-state storage device.

Scheduling Data Scrubbing Operations

Figure 3:
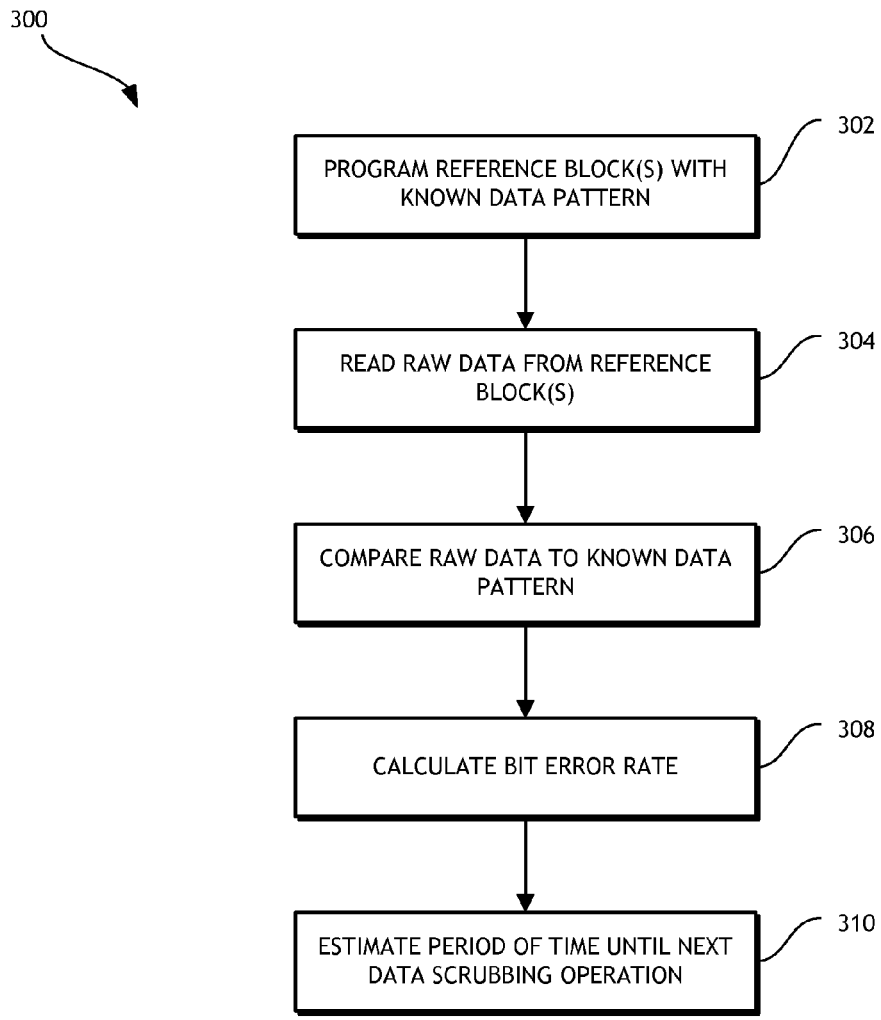
FIG. 3 is a flow diagram showing a process of scheduling data scrubbing operations in a solid-state storage device in accordance with one or more embodiments.

FIG. 3 is a flow diagram showing a process 300 of scheduling data scrubbing operations in a solid-state storage device in accordance with one or more embodiments. In one embodiment, the process 300 is performed at least partially by the controller 130 and/or data retention monitoring module 140. At block 302, one or more reference blocks of the memory device are programmed with a known data pattern, such as a pseudo-random data pattern. After the passage of a period of time, data is read from the one or more blocks at block 304 in order to determine data-retention properties of the reference block(s).

In certain embodiments, the read data is compared to the known data pattern, or patterns. This is performed at block 306. At block 308, the bit error rate (e.g., flipped bit count) may be calculated. In case of more than one reference block, multiple pages may be read out and the average raw bit error rate (RBER) may be used for estimation. The average RBER may be calculated in a number of ways, including any type of weighted average calculation methods. Based on the desired bit-error calculation, the process 300 may include estimating an effective amount of time since the block(s) was programmed and/or the amount of time until a subsequent data-scrubbing operation may be desirably carried out. The process inherently takes into account environmental factors experienced by the device during a power-off state and/or powered state. For example, if a storage device is subjected to excessive heat, such heat may affect data-retention properties of the reference block, such that analyzing values stored in the reference block accounts for effects of the heat. Simply using a time-stamp, on the other hand, may not account for environmental effects in the same way.

The estimation of block 310 may be performed according in any desirable manner. For example, in an embodiment in which the threshold for data scrubbing is ER1 (e.g., where ER1<<1), based on a difference between the measured RBER value and ER1, a period time before the next data scrubbing operation should be performed may be estimated. For example, a small difference between RBER and ER1 (which indicates that the error rate is approaching the threshold) may lead to a next scrubbing being scheduled in a short period of time.

In certain embodiments, the reference blocks are re-assigned dynamically. For example, when a static wear leveling (SWL) event (e.g., highest P/E-count block has 400 more P/E cycles than the lowest P/E-count block for entire device) occurs, data of the highest P/E-count block (SWL source) may be moved to one of the reference blocks (SWL destination). Thereafter, the SWL source block, which may have the highest P/E count, may be erased and assigned to be a reference block. In this fashion, the reference block can be re-assigned dynamically, wherein the P/E count of the respective blocks is substantially close to be the highest within the device. As garbage collection and data scrubbing continue running in background, certain data blocks (user or system) P/E count will increase, such that SWL events will continue to occur, at which point other reference blocks may be selected as SWL destination.

In certain embodiments, some, all, or substantially all, pages in a reference block are programmed. However, it may only be necessary to read one or two typical pages of the reference block for data retention estimation purposes. Therefore, reference block reading may require only a short period of time during power-on (e.g., in the order of 50 µs). In addition, the pre-defined data pattern for the reference blocks can be generated by a pseudo random number generator with a known seed (e.g., 0). Therefore, the data pattern may not need to be stored physically.

Estimating Time Since Last Programming Through RBER

Figure 4:
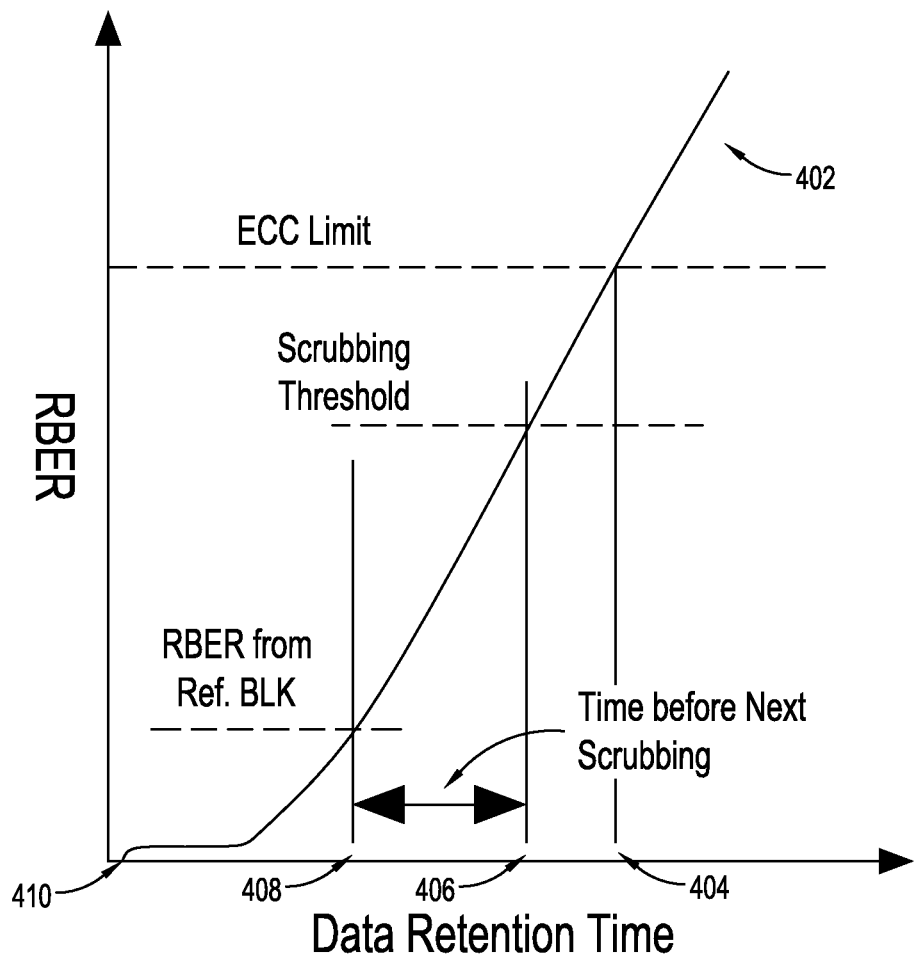
FIG. 4 illustrates a graph providing data retention estimation information according to one embodiment.

The process 300 may be compatible with different solid-state memory devices, and may be performed in order to gather data from the reference blocks to determine an elapsed time since a prior program operation. The diagram shown in FIG. 4 provides additional information regarding how data scrubbing may be scheduled based on the determined raw bit error rate (RBER) according to one embodiment. FIG. 4 shows the relationship between elapsed time since programming (X-axis) and RBER (Y-axis). The curve 402 shows that as the elapsed time since last programming increases, the RBER rises. Once a certain amount of time has elapsed since last programming (time point 404), the degradation in data retention reaches a point where an attempted read from the memory block (e.g., from a page) will result in the RBER reaching the ECC limit (e.g., ECC limit of the page). In other words, at time point 404 a read of a page may result in a number of bit errors that exceeds the amount of bit error that the ECC is configured to correct, leading to potential loss of data. To prevent this from occurring, a scrubbing threshold is set below the ECC limit, so a data scrubbing will be triggered at time point 406. Since the data scrubbing includes a new program operation, it will reset the curve 402 to the time point 410 (the data is now freshly programmed).

The slope/shape of the curve 402 can be pre-characterized for the reference memory block. Thus, at a particular given point in time (take example time point 408), upon determining the RBER for that time point, an elapsed time since last programming (i.e., distance between time points 410 and 408) can be estimated. The RBER can also be extrapolated to estimate the time at which the relevant block or blocks will reach the scrubbing threshold (distance between time points 408 and 406). As can be seen, the higher the RBER, the shorter the time between the current time and the time at which scrubbing is triggered, and vice versa. The extrapolation may be adjusted according to environmental factors, in one embodiment. For example, if the current drive temperature is high, the next scheduled scrubbing may be moved up even further than the time as noted in the graph, or the next scheduled scrubbing may be given a higher priority relative to other tasks in the system, such that it may be performed sooner.

Estimating Time Since Last Programming Through Read Voltage Thresholds

Figure 5A:
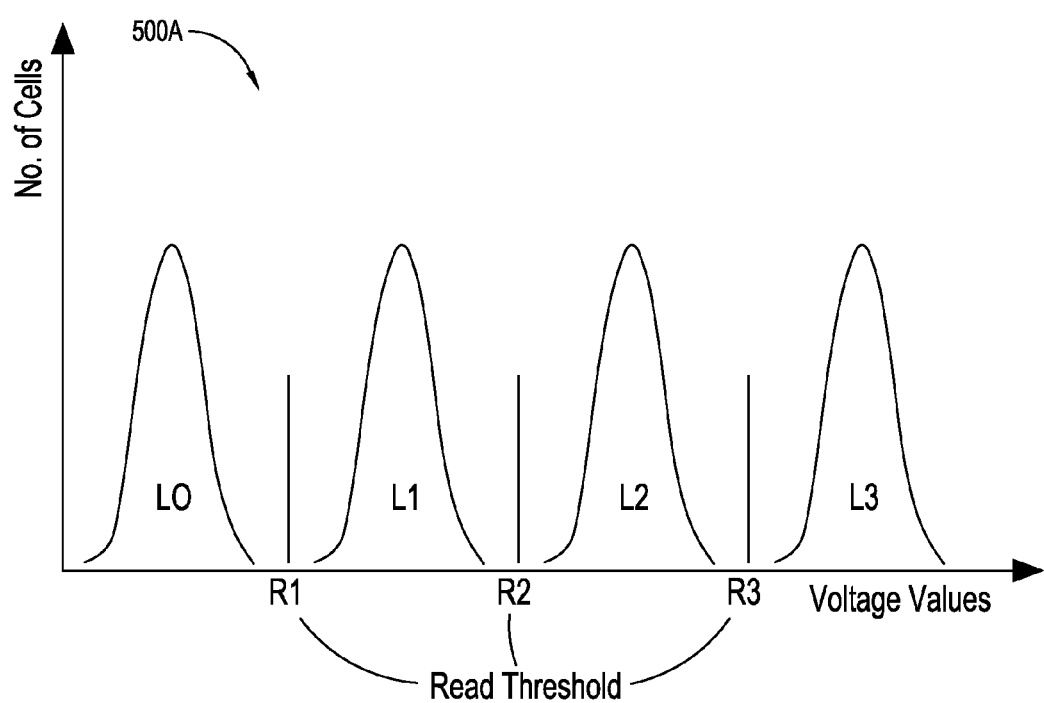
FIG. 5A is a graph showing a probability distribution of cells in a non-volatile solid-state storage device according to one embodiment.

In addition to using the bit error rate, other methods or mechanisms may be utilized in accordance with embodiments disclosed herein for estimating data retention properties of a group of blocks within a solid-state storage device. For example, changes in read voltage thresholds may provide information upon which data retention estimation may be based. To help explain such concepts, FIG. 5A provides a graph showing an embodiment of a probability distribution of cells in a non-volatile solid-state storage device. Flash memory, such as multi-level cell (MLC) NAND flash memory, may store two bits of information per cell. While certain embodiments disclosed herein are described in the context of MLC's, it should be understood that the concepts disclosed herein may be compatible with single-level cell (SLC) technology, or other types of technology.

The horizontal axis depicted in FIG. 5A represents voltage read level. The vertical axis represents the number of cells that have the corresponding voltage values. Thus, the four distribution curves represent the number of cells, broken down by the four distributions, that have the corresponding voltage values. As shown, the voltage distribution of the memory cells 500A may include a plurality of distinct levels (e.g., levels L0-L3 for MLC). Read reference values (i.e., voltage threshold levels R1-R3) may be placed between these levels. The gap between the levels (i.e., margin between programmed states), in which the read voltage references may advantageously be positioned in certain embodiments, is referred to as "read margin." Over time, and as a result of various physical conditions and wear from repeated P/E cycles, the read margins between the various distribution levels may be reduced, resulting in both data retention problems and higher read errors beyond certain limits. Such reduction in read margin may be due to a number of factors, such as loss of charge due to flash cell oxide degradation, over-programming caused by erratic program steps, programming of adjacent erased cells due to heavy reads or writes in the locality of the cell, and/or other factors.

Figure 5B:
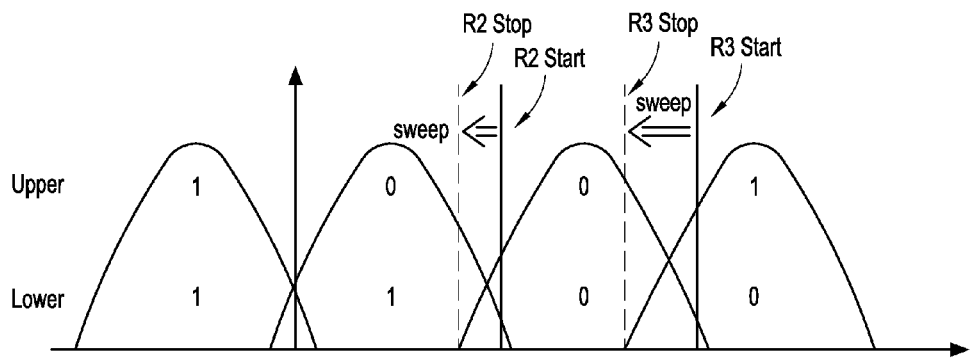
FIG. 5B is a graph showing a probability distribution of cells having reduced read margins in a non-volatile solid-state storage device according to one embodiment.

FIG. 5B is a graph showing a probability distribution of cells having reduced read margins in a non-volatile solid-state storage device according to one embodiment. The programmed logic value (L3) of the cell shown in FIG. 5B may be set to a particular binary value, such as, e.g., 10. Likewise, each of the remaining levels (L0-L2) may correspond to distinct binary values (e.g., 11, 01, and 00, respectively). As shown in the figure, the individual humps representing the various read levels have migrated to the left, such that the respective read margins between read levels has been reduced, or disappeared entirely. As a result, the voltage thresholds R1-R3 need to be shifted to compensate for the change. Therefore, by determining a current voltage threshold level between two read levels and comparing such a current voltage threshold level to the original threshold level, information may be derived regarding how the data retention properties of the cell have changed. Using the data retention information, as with the embodiments disclosed above, a data scrubbing schedule may be determined.

Figure 5C:
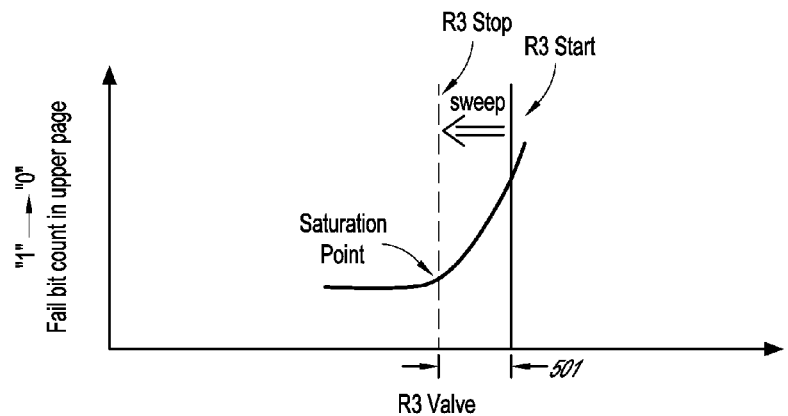
FIG. 5C is a graph showing programming error at various voltage read levels for cells as shown in FIG. 5B.
Figure 6:
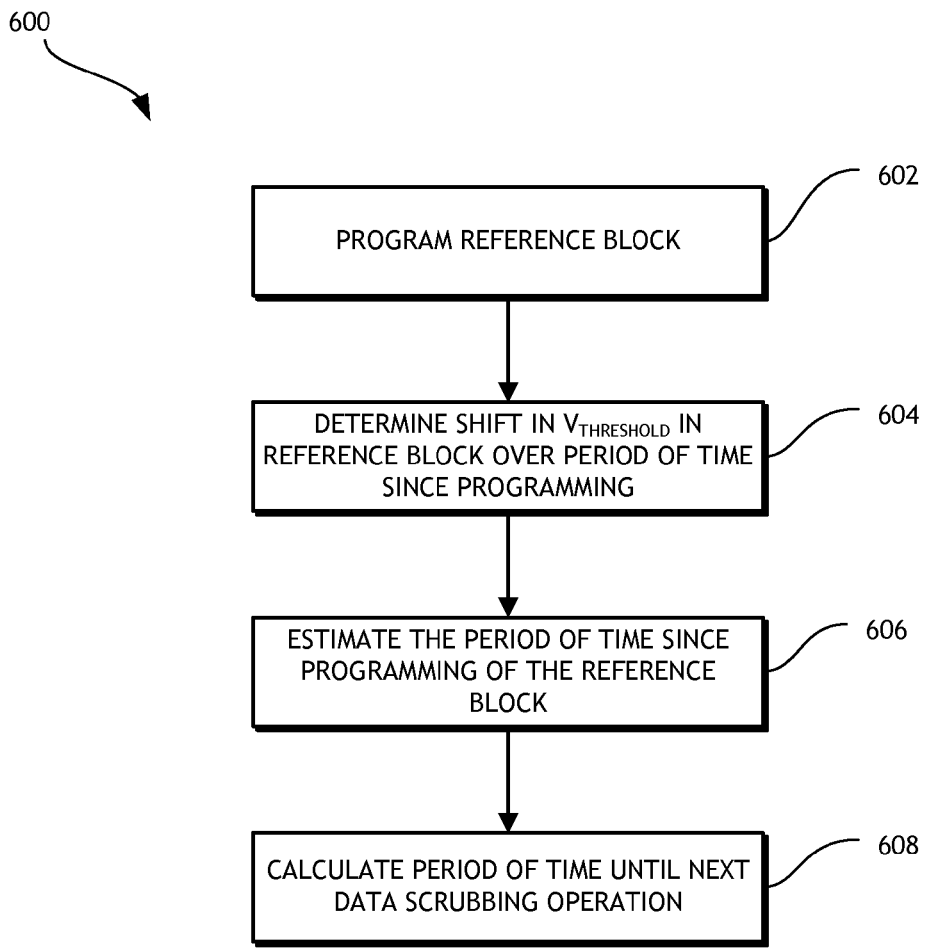
FIG. 6 is a flow diagram showing a process of scheduling data scrubbing operations in a solid-state memory device in accordance with one or more embodiments.

In certain embodiments, as illustrated in FIG. 5C, the shift in $V_T$ between the highest voltage level (e.g., L3) and next-highest voltage level (e.g., L2) can be used to estimate the data scrubbing schedule. For example, FIG. 6 illustrates a process that may be utilized to calculate the data scrubbing schedule based on $V_T$ shift. In one embodiment, the process 600 is performed at least partially by the controller 130 and/or data retention monitoring module 140. The process 600 includes programming a reference block at block 602. The shift in $V_T$ between two voltage levels, such as between the highest and next-highest levels, is determined for one or more cells of the reference block at a period of time after the block was programmed. This is performed at block 604. At block 606, the shift in $V_T$ is used to estimate the period of time since the reference block was programmed and/or the time at which a subsequent data scrubbing operation is to be executed.

Estimating the data retention properties and/or data scrubbing schedule based on $V_T$ shift may be done in a number of ways. With further reference to FIGS. 5B and 501 of FIG. 5C, the shift in a $V_T$ may be done by sweeping the voltage threshold R3 to the left (see FIGS. 5B-C "R3 Start" to "R3 Stop") until a saturation point is reached, wherein further sweeping to the left provides marginal improvement in reduction of flipped bits. With respect to the embodiment of FIG. 5B, bit error detected when sweeping $V_T$ likely corresponds to a flipped upper page bit from 1 to 0, which is the distinction between the highest level (L3) and the next-highest level (L2).

Figure 5D:
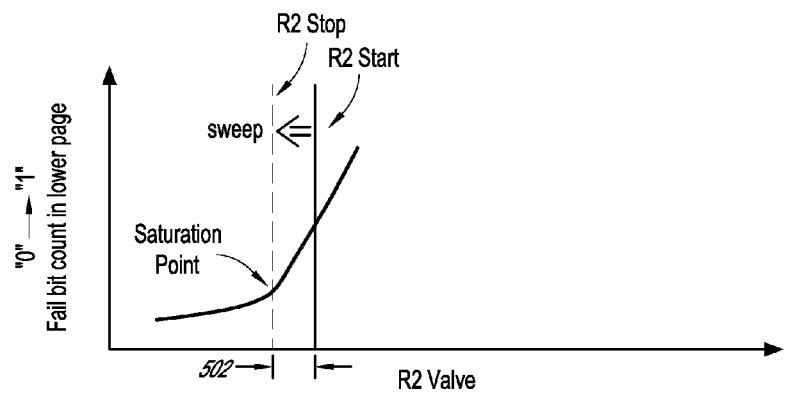
FIG. 5D is a graph showing programming error at various voltage read levels for cells as shown in FIG. 5B.

The graph of FIG. 5D corresponds to a shift in a $V_T$ between second (L2) and third voltage (L1) levels. As shown in FIG. 5B and at 502 of FIG. 5D, the threshold R2 is swept left in a similar fashion to the embodiment of FIG. 5C until the saturation point is reached. In the depicted embodiment, the bit error detected when sweeping $V_T$ likely corresponds to a flipped lower page bit from 0 to 1, which is the distinction between the relevant voltage levels. The shift 502 provides information from which data retention properties can be derived.

With respect to various embodiments of detecting a $V_T$ shift, the embodiment of FIG. 5C may be preferable as higher voltage levels may suffer voltage shift to a greater extent due to data retention issues, as show by the relative size of shifts 501 and 502. In certain embodiments, it may be desirable for the reference block and/or measured cells to represent the highest, or relatively high, error in order to reduce the likelihood that blocks or cells will experience uncorrectable error. Although the embodiments disclosed herein are often described in the context of two-bit modulation technology, the disclosed systems and methods may be applicable to systems using any number of bits per cell technology. It should be noted that any of the system disclosed above may be configured to at least partially take account of the cumulative effect of multiple data retention factors, such as time and temperature.

Figure 7:
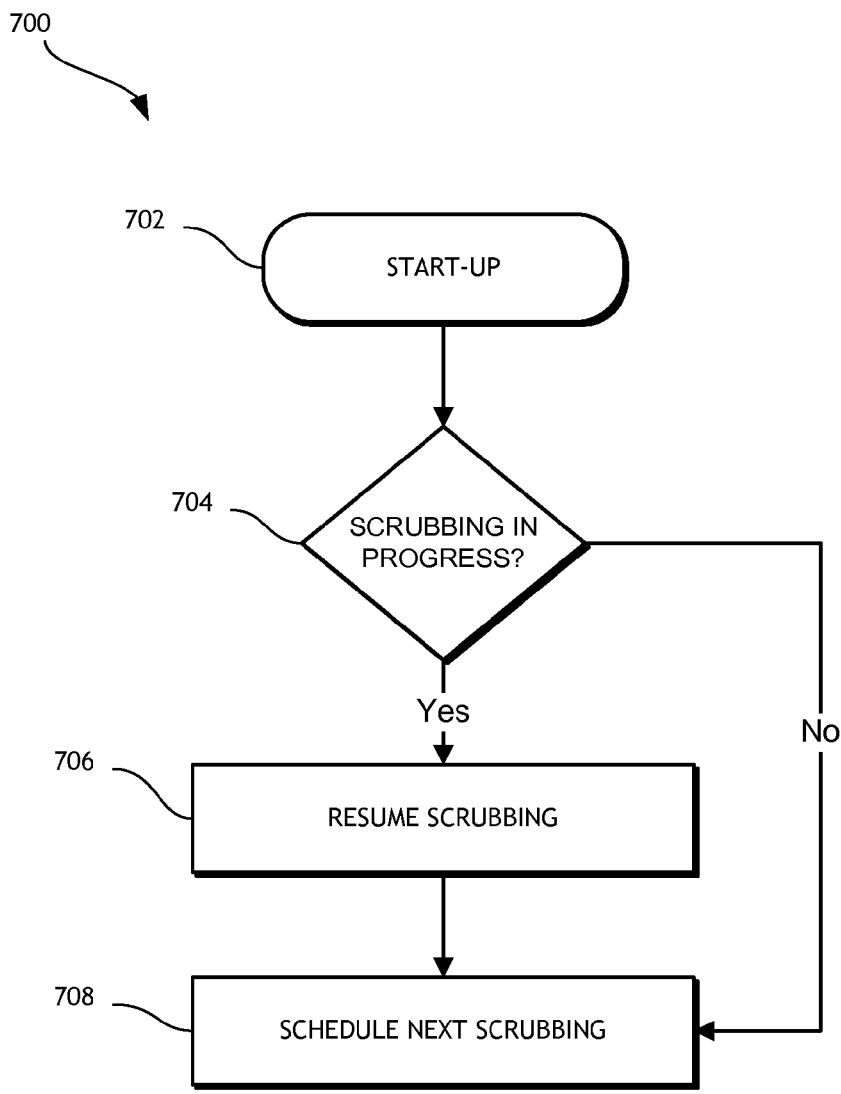
FIG. 7 illustrates a flow chart for a process for resuming a previously-initiated data scrubbing operation following power-up according to one embodiment.

FIG. 7 illustrates a flow chart for a process for resuming a previously-initiated data scrubbing operation following power-up. In one embodiment, the process 700 is performed at least partially by the controller 130 and/or data retention monitoring module 140. In the case where data scrubbing is terminated before being finished (e.g., due to power-off), the process of FIG. 7 may provide a mechanism for handling such a situation when reference-block functionality is utilized.

The process 700 begins at block 702, where a data storage device is powered on. After certain initialization, certain system data may be read from the solid-state memory to check a value (e.g., activity flag) to determine if there was a data scrubbing, garbage collection, and/or static wear leveling operation running at power-off. Such step is performed at decision block 704. If so, it may be desirable for the storage device to continue execution of such operation(s). If no such operation is pending, the process 700 resumes normal operation, wherein a next data scrubbing event may be scheduled in accordance with one or more embodiments disclosed herein. The checked flag may indicate an unfinished data operation in a last power-on period. Therefore, the system may need to record up to which block the scrubbing or other operation had been performed before power off.

At block 706, the scrubbing or other operation is resumed, preferably at a point related to where the operation previously terminated. This allows for unfinished operations including possibly scrubbing, garbage collection and static wear leveling, to be performed before anything else. In certain embodiments, one or more reference blocks are scrubbed first.

The process 700 may continue with reading data from the one or more reference blocks and estimating data retention properties/characteristics based on one or more of the methods disclosed above. Based on the result, the process may include re-scheduling data scrubbing accordingly. Generally, the worse of data retention properties, the sooner of data scrubbing will be scheduled.

The various embodiment disclosed herein may provide one or more of the following advantages. First, as discussed above, some known techniques to track data retention time are to add real-time stamp in meta data area every time when a page is programmed. By doing so, the duration of data retention may be recorded, but the data doesn't account for P/E cycle or temperature factors. Reference blocks may have substantially the same experience as the data blocks, so the RBER value obtained by reading the raw data from the reference blocks and comparing against the pre-defined pattern may reflect almost all the possible factors of characteristic change on the solid-state memory devices. Such factors may include P/E cycle, inter-cell interference, data retention time, and temperature, even with respect to device condition during power-off. Furthermore, the implementation of reference blocks can enable a dynamic data scrubbing scheme which can improve the system performance without substantially losing reliability, such as by using less-frequent data scrubbing for a fresh product and more-frequent data scrubbing for a cycled product.

In addition, because reference blocks are not dedicated blocks, issues associated with wasting storage capacity, like what has been found with a real time stamp method, are marginalized. Reference blocks can be dynamically assigned from the data blocks each time static wear leveling occurs. In addition, because reference blocks are programmed with pre-defined data pattern, the feasibility of fine-tuning of the read levels with the calibration results from the reference blocks may be enabled.

Other Variations

As used in this application, "non-volatile memory" typically refers to solid-state memory such as, but not limited to, NAND flash. However, the systems and methods of this disclosure may also be useful in more conventional hard drives and hybrid hard drives including both solid-state and hard drive components. The solid-state storage devices (e.g., dies) may be physically divided into planes, blocks, pages, and sectors, as is known in the art. Other forms of storage (e.g., battery backed-up volatile DRAM or SRAM devices, magnetic disk drives, etc.) may additionally or alternatively be used.

Those skilled in the art will appreciate that in some embodiments, other types of data storage systems and/or data retention monitoring can be implemented. In addition, the actual steps taken in the processes shown in FIGS. 2, 3, 6, and 7 may differ from those shown in the figures. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage device capable of monitoring data-retention properties of solid-state memory, comprising:
   a non-volatile solid-state memory array comprising a plurality of block groupings, each block grouping including one or more blocks; and
   a controller configured to:
      store a predetermined data pattern in a reference block, the reference block comprising a first block in a first block grouping from the plurality of block groupings, the reference block having data retention properties at least partially representative of data retention properties of a second block in the first block grouping;
      read data values stored in the reference block;
      determine an estimated amount of time that elapsed between the storing of the predetermined data pattern and the reading of the data values at least in part by calculating a bit error rate of the read data values based on comparing the read data values with the predetermined data pattern; and
      determine a data scrubbing schedule based at least in part on the estimated amount of elapsed time.

2. The storage device of claim 1, wherein the controller is configured to store the predetermined data pattern in the reference block in response to a wear leveling event.

3. The storage device of claim 1, wherein the controller is further configured to select, as the reference block, a block that has a program-erase count that is the highest among the group of blocks.

4. The storage device of claim 1, wherein the predetermined data pattern comprises a pseudo-random number generated using a known seed value.

5. The storage device of claim 1, wherein the bit error rate provides information relating to a physical environment in which the non-volatile solid-state memory array was disposed during a past time period.

6. A method of monitoring data retention in a data storage device that comprises blocks of memory, the method comprising:
   storing a first predetermined data pattern in a first reference block, the first reference block comprising a first block in a group of blocks of a data storage device, the first reference block having data retention properties at least partially representative of data-retention properties of a second block in the group of blocks;
   reading data values stored in the first reference block to determine the data retention properties of the first reference block; and
   calculating a time period for performing a future data scrubbing operation by calculating a bit error rate of the read data values based on comparing the read data values with the first predetermined data pattern;
   wherein the method is performed under the control of a controller of the storage device.

7. The method of claim 6, further comprising performing a data scrubbing operation on at least one block in the group of blocks during the time period.

8. The method of claim 7, further comprising dynamically reassigning the first reference block to another block of the group of blocks following performance of the data scrubbing operation.

9. The method of claim 6, further comprising:
   determining whether a past data scrubbing operation was pending during a previous shut-down of the data storage device; and
   when it is determined that the past data scrubbing operation was pending, resuming execution of the data scrubbing operation prior to calculating the future data scrubbing time period.

10. The method of claim 9, further comprising storing a second predetermined data pattern in a second reference block, wherein the first reference block and second reference block are stored in different physical memory units of the data storage device.

11. The method of claim 6, wherein calculating the future data scrubbing time period is at least partially based on a difference between the bit error rate and a predetermined threshold error rate.

12. The method of claim 6, further comprising storing the first predetermined data pattern in one or more additional reference blocks, wherein calculating the future data scrubbing time period comprises calculating an average bit error rate of the first reference block and the additional reference blocks with respect to the first predetermined data pattern.

13. The method of claim 6, wherein calculating the future data scrubbing time period comprises reading a page of the first reference block using a predetermined reference read level voltage and sweeping the read level voltage until a second predetermined data pattern is read from the first reference block.

14. The method of claim 6, wherein calculating the future data scrubbing time period comprises determining a threshold voltage read level of a page of the first reference block and comparing said threshold voltage read level with a predetermined default voltage read level.

15. A method of monitoring data retention in a data storage device that comprises blocks of memory, the method comprising:
    selecting a first block from a group of blocks of the data storage device as a first reference block, the first reference block having data retention properties at least partially representative of data-retention properties of a second block in the group of blocks;
    reading data values stored in the first reference block to determine a shift in a threshold read voltage level between two programming levels of memory cells in the first reference block; and
    calculating a time period for performing a future data scrubbing operation based at least in part on the determined shift in the threshold read voltage level,
    wherein the method is performed under the control of a controller of the storage device.

16. The method of claim 15, wherein the two programming levels include a highest programming level of the memory cells.

17. The method of claim 15, wherein the two programming levels include second-highest and third-highest programming levels of the memory cells.

18. The method of claim 15, wherein reading data values stored in the first reference block to determine a shift in a threshold read voltage level comprises performing a plurality of reads on the cells with different voltage thresholds to determine the shift.

19. The method of claim 18, wherein the performing a plurality of reads on the cell comprises:
    reading the cells with a voltage threshold;
    determining an amount of error encountered;
    adjusting the voltage threshold;
    re-reading the cells with the adjusted voltage threshold and determining a change in the amount of error encountered; and
    repeating the reading, determining and adjusting until a rate of the change in the amount of error encountered reaches a pre-determined saturation threshold.

20. A data storage device capable of monitoring data retention properties of solid-state memory, comprising:
    a non-volatile solid-state memory array comprising a plurality of block groupings, each block grouping including one or more blocks; and
    a controller configured to:
        select a first block from a first block grouping of a plurality of block groupings of the data storage device as a first reference block, the first reference block having data retention properties at least partially representative of data-retention properties of a second block in the first block grouping;
        read data values stored in the first reference block to determine a shift in a threshold read voltage level between two programming levels of memory cells in the first reference block; and
        calculate a time period for performing a future data scrubbing operation based at least in part on the determined shift in the threshold read voltage level.

21. The data storage device of claim 20, wherein the two programming levels include a highest programming level of the memory cells.

22. The data storage device of claim 20, wherein the two programming levels include second-highest and third-highest programming levels of the memory cells.

23. The data storage device of claim 20, wherein the controller is configured to read data values stored in the first reference block to determine a shift in a threshold read voltage level by performing a plurality of reads on the cells with different voltage thresholds to determine the shift.

24. The data storage device of claim 23, wherein the performing a plurality of reads on the cell comprises:
    reading the cells with a voltage threshold;
    determining an amount of error encountered;
    adjusting the voltage threshold;
    re-reading the cells with the adjusted voltage threshold and determining a change in the amount of error encountered; and
    repeating the reading, determining and adjusting until a rate of the change in the amount of error encountered reaches a pre-determined saturation threshold.

* * * * *